United States Patent [19]

Grantham et al.

[11] 4,401,367
[45] Aug. 30, 1983

[54] METHOD FOR PATTERN MASKING OBJECTS AND THE PRODUCTS THEREOF

[75] Inventors: Daniel H. Grantham, Glastonbury; James L. Swindal, East Hampton, both of Conn.

[73] Assignee: United Technologies Corporation, Hartford, Conn.

[21] Appl. No.: 203,824

[22] Filed: Nov. 3, 1980

[51] Int. Cl.³ .............................................. G02B 5/18
[52] U.S. Cl. ......................... 350/162.22; 350/162.23
[58] Field of Search .......... 350/162 R, 162.22, 162.23; 204/129.1; 156/643, 663, 657

[56] References Cited

U.S. PATENT DOCUMENTS

| | | | |
|---|---|---|---|
| 3,814,641 | 6/1974 | Reinberg et al. | 156/663 |
| 3,935,333 | 1/1976 | Muneoka et al. | 204/129.1 |
| 4,155,627 | 5/1979 | Gale et al. | 350/162 R |
| 4,227,769 | 10/1980 | Phillips et al. | 350/162 R |
| 4,255,019 | 3/1981 | Knop | 350/162 R |
| 4,295,923 | 10/1981 | Kasper | 156/657 |
| 4,330,175 | 5/1982 | Fujii et al. | 350/162 R |

Primary Examiner—John K. Corbin
Assistant Examiner—William Propp
Attorney, Agent, or Firm—Stephen A. Schneeberger

[57] ABSTRACT

A method is provided for pattern masking objects preparatory to subsequent working of the objects. The invention also includes those objects prepared in accordance with the method. The method is especially suited to the pattern-masking of relatively large and/or complexly shaped optical elements preparatory to the production of diffraction gratings thereat for use with laser radiation.

The object to be worked, such as a mirror, is coated with a semiconductive masking material. Electrolytic etchant is placed on the masking material. Electromagnetic radiation of suitable wavelength and patterned in accordance with the desired pattern of the mask is projected through the etchant and onto the masking material. The radiation effects photoelectrochemical etching of the semiconductive masking material in the desired pattern to a desired depth. An etch-stop layer may be interposed between the object and the masking material to limit the etching action. The desired working of the substrate object, as for instance the formation of diffraction gratings thereat, may then be achieved, as by ion milling, deposition, or the like. The mask, and etch stop, if any, may finally be totally removed by suitable etch baths.

38 Claims, 4 Drawing Figures

METHOD FOR PATTERN MASKING OBJECTS AND THE PRODUCTS THEREOF

DESCRIPTION

1. Technical Field

This invention relates to a method for pattern-masking the surface of an object and to such objects so masked. The invention additionally relates to the utilization of such pattern-masks in the formation of various products and to such products so formed. The invention relates more specifically, though not exclusively, to the method of producing gratings on optical elements.

2. Background Art

In the manufacture of various objects or products, it is occasionally necessary to perform operations on the object which require masking of certain portions of the surface of the object. One such example thereof arises in the production of gratings in large mirrors for high power lasers. Those gratings are used for diffracting a small fraction of the beam from a number of locations to be examined for beam quality and to effect feedback control of that quality. The mirrors must be capable of enduring operation with high power beams incident thereupon. Three approaches for producing those mirror gratings are:

1. Eroding a pattern in the mirror surface to a depth of about 100 Å–1,000 Å;
2. Deposition of a pattern of thin films (100 Å to 1,000 Å) of materials with the same or different reflectivity from that of the reflector material; or
3. Ion implantation to produce local variations in the mirror reflectivity.

Each technique has certain advantages, though etching appears to be most easily applied. More importantly, the one problem common to each of the general methods of grating formation listed is the production of a mask negative on the surface of the optical element or mirror so that the desired pattern can be formed. This mask is necessary to protect the mirror against etching in selected areas or to assure deposition only in selected other areas.

The most common technique for masking most such surfaces including that of a mirror, preparatory to etching or some other material addition or removal operation to the substrate, includes the use of a photo-resist coating applied to the substrate and generally or selectively irradiated by ultraviolet light to form the resistant areas of the mask. If the mask is to be patterned, the ultraviolet illumination may be prepatterned and projected onto the coating, as by using holographic techniques, or the ultraviolet light may be generally projected through a mask in contact with the coating. The various techniques used for applying the photo-resist coating to the surface of the mirror or other substrate include spinning, spraying, dipping and the like. The various deposition techniques, including vacuum evaporation and sputtering, are not generally suited to the application of photo-resist because those processes inevitably lead to destruction of the organic molecular structure responsible for the required photopolymerizability of the material.

In the event the surface to be worked is large (i.e. greater than about 25 square inches) and/or curved (i.e. concave), the aforedescribed techniques of applying photo-resist coatings are extremely difficult to employ if uniformity in the photo-resist is desirable or essential.

Yet another, and somewhat more specific, problem arises when the product to be formed is such as a sampling grating for a beam of laser light. A high degree of accuracy and resolution to the grating and thus the patterning of the mask, is required. Moreover, if the sampling grating is to be used with laser light in the infrared range, ultraviolet light can be used to form an interferogram to polymerize the photo-resist material only if complicated transformation techniques are employed.

Photoelectrochemical erosion or etching of semiconductors has been previously employed for the purpose of finishing the surface of the semiconductive element and/or creating various recesses therein as for the deposition therein of semiconductive material of a different conductivity type. In photoelectrochemical etching of a semiconductor, the semiconductor surface to be etched is contacted by a suitable electrolytic etchant and the etching process is then initiated and/or accelerated and controlled by either general or localized illumination of the semiconductor, as described in "Electrolytic Shaping of Germanium and Silicon" by A. Uhlir, Jr., Bell System Technical Journal, beginning at page 333 (1956).

More recently, as described in "Control of Photochemical Etching of a Semiconductor in Hologram Recording" by Belyakov et al, in Zhurnal Teknicheskoi Fiziki, Vol. 24, No. 4, April 1979, translated pages 511 & 512, photoelectrochemical etching has been used in the recording of holographic diffraction gratings. With that method, it is possible to produce on the surface of a semiconductor a profile that corresponds to the distribution of the illumination over the surface. While such semiconductor gratings may be suitable for use with holograms, they would not be expected to be suitable as a sampling grating for high power laser beams because of the extreme heat of the beam.

DISCLOSURE OF INVENTION

It is the principal object of the present invention to provide an improved method for pattern-masking objects to be subsequently worked.

It is another object of the present invention to provide an improved method for pattern-masking relatively large and/or curved optical elements.

It is yet a further object of the invention to provide an improved method for pattern-masking optical elements for the formation of gratings thereon. Included in this object is the provision of such gratings especially suitable for use with infrared laser light.

It is a still further object of the present invention to provide a method for pattern-masking objects which does not require the utilization of photo-resist materials irradiated by ultraviolet light.

It is yet another object of the present invention to provide pattern masked optical elements and/or other objects made in accordance with the method of the invention.

In accordance with the present invention, there is provided a novel method for pattern masking objects prior to subsequent working of those objects. More specifically, the invention is especially suited to the pattern-masking of relatively large and/or complexly shaped optical elements preparatory to the production of diffraction gratings thereat for use with infrared and other radiation emanating from lasers, especially high power lasers.

A thin uniform coating of semiconductive masking material is disposed over the surface of the object to be worked. An electrolytic etchant is placed and maintained in contact with the outer surface of the semiconductive masking material. Electromagnetic radiation of suitable wavelength and patterned in accordance with the desired pattern of the mask is projected through the etchant and onto the semiconductive masking material. For instance, if a diffraction grating for an infrared laser beam is to be produced, the patterned light may be an interferogram of infrared radiation. The wavelength of the electromagnetic radiation is sufficiently short, and the photon energy thereby great enough for hole-electron pair production in the semiconductor. The semiconductor is thereby electrolytically etched by a minority carrier mechanism. The rate at which the pattern is etched into the semiconductive material is controlled by the intensity of the electromagnetic radiation (and to some extent by the potential applied to an external circuit connecting the electrolytic etchant and semiconductor). The photoelectrochemical etching is continued until a desired depth of etch has been attained. The desired working of the substrate object, as for instance the formation of diffraction gratings thereat may then be achieved as for instance through use of ion milling, deposition or other techniques.

To prevent the etchant from inadvertently etching through the mask and into the substrate object, a layer of etch stop material may be formed, as by deposition, over the surface of the substrate object prior to the deposition of the semiconductive mask material. The etch stop material is selected to be inert to the etchant or to react with the etchant to form insoluble compounds, such as oxides, when the mask is etched through. The subsequent ion milling would first penetrate the etch stop layer and then the material of the substrate object itself.

If the grating or other surface to be produced is to include varying depths and the substrate object is to be erosively worked or machined, the semiconductive mask may also be etched to generally corresponding variable depths. This may be accomplished by varying the intensity of the illumination within the projected etched pattern. Following machining of the substrate object, the semiconductive mask may be suitably removed, as by etches not requiring photo generated minority carriers.

The semiconductive material selected for the mask may be germanium, silicon or any of many other common such materials. The semiconductor is preferably of the n type, though p-type materials are also satisfactory.

BEST MODE FOR CARRYING OUT THE INVENTION

Figure 1:
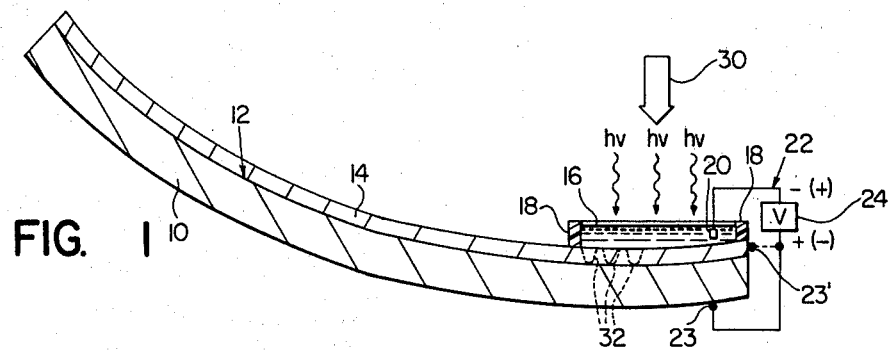
FIG. 1 is a diagrammatic sectional view of an object to be masked in accordance with the invention.

Referring to FIG. 1, there is illustrated a substrate object, as for instance mirror 10, on or in the upper reflective surface 12 of which there is to be formed a sampling or diffraction grating. In the illustrated embodiment, mirror 10 is of a type conventionally used with high power lasers and specifically, such lasers operating in the infrared range. Mirror 10 is generally circular and of large diameter, normally having an area greater than 25 square inches and in the illustrated embodiment having an area of more than 100 square inches. The reflective surface 12 of mirror 10 is concavely curved and the mirror may be considered spherical. Mirror 10 is generally hollow for circulation of cooling water therethrough and is formed in the main of a durable heat conductive material, generally a metal such as copper, molybdenum, stainless steel or the like. The mirror surface may be plated with gold, chromium, or the like (not shown) to improve reflectivity and/or the life of the reflective surface.

After first polishing the reflective surface 12 of mirror 10, a layer or coating 14 of semiconductive mask material is deposited on surface 12 by vacuum evaporation or sputtering to a thickness in the range of 1,000 Å–10,000 Å, in this instance approximately 5,000 Å. The semiconductive coating 14 is of very uniform thickness, typically having a uniformity of ±5% or better, such that it is within the tolerances on the depths of the grating to be formed in the mirror 10.

A suitable liquid or gel-type electrolytic etchant 16 is then placed in contact with the upper surface of semiconductive coating 14 and is maintained thereat by a confinement structure or dam 18. Dam 18 may be constructed of wax, electroplaters stop-ff or other suitable material. Dam 18 serves to confine contact of the etchant to the semiconductive layer 14. Although etchant 16 may cover the entire upper surface of semiconductive layer 14 at one time, it is preferably confined to a smaller area as illustrated in FIG. 1 because of greater ease of realizing abberation-free transmission of the light pattern to the semiconductor surface and is repositioned on the surface of coating as necessary to accomplish etching of other portions of the semiconductive coating 14.

An electrode 20, as for instance of foil, is immersed in the electrolytic etchant 16 and comprises one end of an external conductive circuit generally designated 22. The other end or contact 23 of circuit 22 is connected to the metal mirror 10 such that electrically it is substantially directly in contact with that surface of semiconductive coating 14 which is remote from the surface in contact with the etchant. A battery 24 or comparable source of DC potential is connected in the external circuit 22 for applying a biasing potential between the etchant 16 and the surface of semiconductive coating 14 removed therefrom. If the depth and rate of etch in semiconductive mask 14 is to be quite limited, it is possible to eliminate the external circuit. Moreover, in certain instances, such as with silicon, the potential required of battery 24 may be nil and thus it may be omitted such that circuit 22 is effectively a short circuit. However, in most instances the bias voltage will be in the range of 0.25 to 5.0 volts depending upon the particular semiconductive material used and the electrolytic etchant and/or the desired rate of etching. In the event mirror 10 is fabricated of a non-conductive material, it is necessary to replace the circuit contact 23 at the mirror with an alternate contact 23' connected to an edge surface of the semiconductive coating 14. Assuming the semiconductive material of coating 14 is of the n conductivity type, the polarity of battery 24 is such that the mirror 10 and surface of semiconductor 14 in contact therewith are anodic and the electrode 20 comprises the cathode. Of course, if the semiconductive material 14 is of the p type, the polarity of battery 24 and the positions of the anode and cathode will be reversed.

The process of photoelectrochemically etching semiconductors is known and if additional information is desired, detailed discussions of various aspects thereof may be found in the relevant literature including the aforementioned articles by Uhler and Belyakov et al, and also in the text entitled "Electrochemistry of Germanium and Silicon" by E. A. Efimov and I. G. Erusalimchik published in 1963 by the Sigma Press and in an article entitled "Electrochemical Behavior of Semiconductors Under Illumination" by H. Gerischer, appearing at pages 1174–1182 in the Journal of the Electrochemical Society (November 1966). Generally speaking, when electromagnetic radiation, and specifically light, is incident with a semiconductor, it is capable of producing electron-hole pairs in the semiconductor if the frequency of the light is sufficiently high or conversely, its wavelength is sufficiently short, that the photon energy or quantum is at least sufficient to overcome the energy of the forbidden band of the particular semiconductive material. The minority carriers, e.g. holes in an n-type material, move by diffusion and drift and increase the current flow through an anodic electrolyte n-type semiconductor interface or barrier at whatever point they happen to encounter the barrier. In general, more holes will diffuse to an interface, the nearer the interface is to the point at which the holes are created.

Referring to FIG. 1, the energy E of a photon is represented by hv, in which h is Planck's constant and v is the frequency of the wave train associated with the photon. The equation $E=hv$ can be rewritten in terms of electron volts and wavelengths measured in microns:

electron volts $= (1.23)/(\lambda$ microns)

From this it will be understood that for semiconductors having forbidden band gap potentials ranging up to about 4 electron volt, light having a wavelength below or shorter than about 4 microns (i.e. 40,000 Å) should be sufficient to stimulate electron-hole pair production, with the shorter wavelengths being required for the higher band gap potentials. Indeed, light wavelengths in the infrared frequency range, i.e. about 7500 Å to 10,000 Å, will stimulate electron-hole pair production for semiconductors having forbidden band gap potentials below about 1.3 electron volts. A relatively large number of semiconductive materials may be thus responsive to infrared radiation, particularly if doped to provide significant n or p-type conductivity. As used herein, "semiconductor" or "semiconductive material" means a material which exhibits n or p-type conductivity. Examples of such semiconductive materials which will respond to infrared radiation to produce electron-hole pairs include germanium, gallium arsenide, silicon, indium arsenide, gallium antimonide, and others. The preferred doping is of the n type, though the p-type material may be used as well. In a preferred embodiment, the semiconductive layer 14 is n-type silicon.

For the formation of a diffraction, or sampling, grating for laser light in the infrared range, it is especially convenient to create an interferogram 30, utilizing infrared radiation from a laser source, and to project that interferogram through the etchant 16 and onto the surface of semiconductive coating 14. The interferogram 30 corresponds with the desired pattern of the sampling grating. Should the diffraction grating be intended for use with laser light in the upper visible range, the interferogram 30 would be formed using radiation in that range. For instance, a grating was formed using germanium as the material 14 of the mask and a photo radiation wavelength of 6328 Å.

The electrolytic etchant 16 is selected to electrochemically etch the semiconductive coating 14, with the rate of such etching being greatly accelerated in those localized regions of the semiconductor which are illuminated. The battery 24 provides a driving potential which aids in preventing the formation of a space charge by removing, in an n-type material, electrons from the semiconductor following the electrochemical stripping of positive ions into the electrolyte. Care should be taken in choosing a suitable etchant so as to avoid those which might cause or contribute to the formation of unwanted passivating oxides or other compounds at the surface of the semiconductor. Suitable electrolytes include dilute solutions of ammonium biflouride for silicon masks, sulfuric acid solutions for gallium-arsenide masks, and hydrochloric acid solutions for germanium masks. The photoelectrochemical etching of the semiconductive coating 14 may be continued until the desired diffraction grating pattern, represented by the dotted grooves 32, is formed in the semiconductive mask 14.

Figure 2:
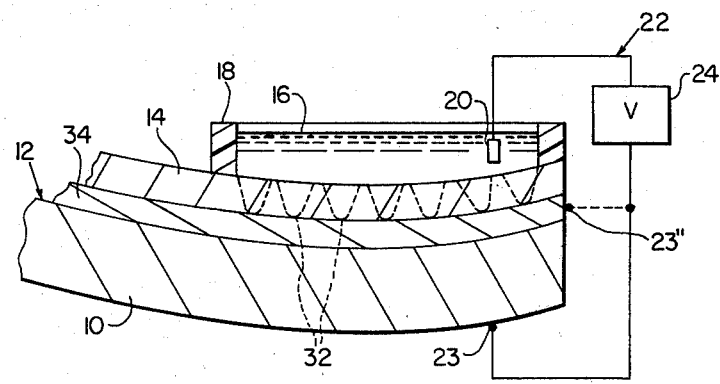
FIG. 2 is a partial diagrammatic sectional view of an object to be masked in accordance with a further embodiment of the invention.

In accordance with another aspect of the invention as represented by the embodiment depicted in FIG. 2, it may be desirable to interpose a layer or coating 34 of etch stop material between the surface 12 of mirror 10 and the semiconductive coating 14. This etch stop layer 34 will serve to prevent the etchant 16 from contacting the surface 12 of mirror 10 in the event portions of the semiconductive mask layer 14 etch through. Moreover, the etch stop layer 34 may serve to automatically terminate the etch forming of the pattern in the semiconductive mask 14. Further still, the etch stop layer 34 may facilitate the subsequent cleansing of the surface 12, as will be hereinafter explained. The etch stop layer 34 can be applied by vacuum deposition of a thin layer, i.e. up to 5,000 Å, of aluminum before the semiconductive layer 14 is deposited on the mirror. Other etch stop materials such as gold or the like might be used. When the etchant 16 etches entirely through the semiconductive layer 14 at one or more of the pattern grooves 32, anodization of the aluminum etch stop layer 34 occurs to form a resistive insoluble aluminum oxide. This resulting aluminum oxide prevents further etching by etchant 16 and thus protects the mirror 10. In the event mirror 10 is nonconductive, the contact 23 of external circuit 22 may be replaced by contact 23'' which is in direct electrical connection with semiconductor coating 14 and the aluminum etch stop layer 34, as illustrated in FIG. 2.

The patterned etching of the semiconductive mask layer 14 is continued until the desired pattern depth is attained. This may be determined by cessation of the etching action upon contact with the etch stop layer 34 as in the FIG. 2 embodiment, or it may be determined by the lapse of a predetermined amount of time established empirically, or it may be determined by an appropriate current integrating device associated with external circuit 22 and being generally indicative of the total amount of semiconductive material removed by the etching operation.

Figure 3:
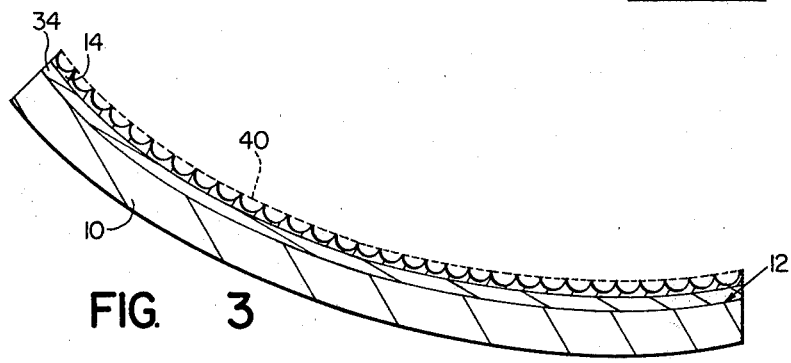
FIG. 3 is a diagrammatic sectional view of a mirror having a mask thereon patterned as a sampling grating.
Figure 4:
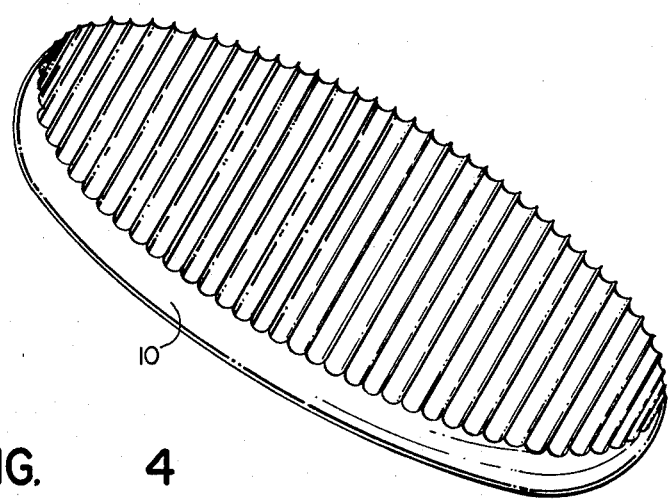
FIG. 4 is a perspective view of the mirror of FIG. 3 following removal of the mask and showing the sampling grating form therein.

In the event the grating is to have a variable depth, as for instance a sinusoid as illustrated in FIGS. 3 and 4, the semiconductive mask layer 14 may be etched to varying depths across its width by correspondingly varying the intensity of the radiation or illumination incident therewith. Generally speaking, the regions of greatest illumination will experience the greatest rate and thus greatest depth of etching and the regions which are essentially nonilluminated will etch at a much slower rate, with regions receiving illumination of intermediate intensity being etched at rates intermediate thereto. FIG. 3 illustrates the result of so etching the semiconductive mask layer 14, with the dotted line 40 representing the original outer surface of that semiconductive coating prior to the etching. The mirror 10 thus pattern-masked is then ready for the production of gratings therein or thereon in accordance with a technique such as one of those mentioned early in this application.

If the grating is to be formed by deposition, it will be necessary for the patterned semiconductive mask 14 to have been etched entirely through to either the etch stop layer 34 or the mirror surface 12. Moreover, the material deposited would have to resist removal by the wash solution subsequently used to remove the semiconductive mask and would have to additionally be able to withstand the high power laser beam incident thereon during normal use of mirror 10. In the event ion implantation techniques are to be used to produce local variations in the reflectivity of mirror surface 12, the pattern in the semiconductive mask 14 should be etched through or nearly through to that surface.

In accordance with a preferred mode of forming the diffraction pattern in the surface 12 of a mirror 10, that surface is etched or eroded by the known technique of ion milling or machining in which a surface is bombarded with accelerated ions to etch or erode material from that surface. In the present instance there is no need to focus the ion energy to conform to the pattern of the desired grating. Rather, the patterned surface of the semiconductive mask 14 may generally receive the incident ion energy and be thereby eroded at some particular rate determined by the ion energy and the particular semiconductive material. This erosion will generally maintain the contour of the pattern in the semiconductive layer and will proceed first through the aluminum oxide and aluminum of etch stop layer 34 if such is present and ultimately into the surface 12 of mirror 10. Because the milling rates of the semiconductor 14 and the mirror 10 may differ, the light intensity distribution of the illumination previously incident upon semiconductor 14 will have been appropriately weighted to compensate for such difference in ion milling rates. The ion milling is continued until the relief of the patterned semiconductive layer has been effectively transferred in to the surface of mirror 10 and provides the desired grating.

Finally, whatever remains of the semiconductive mask 14 and the etch stop 34 is removed by a solvent or etchant wash which does not require photogenerated minority carriers and does not adversely affect the grating pattern finally formed in or on the surface 12 of mirror 10. The particular solvent or etchant used generally depends on the combination of materials used for mask, etch stop and mirror. For example, if the mask is gallium arsenide, the etch stop is aluminum and the mirror is stainless steel or chromium, suitable etchants would be a mixture of sulfuric acid and hydrogen peroxide for the mask and a mixture of nitric and phosphoric acids for the etch stop. On the other hand, if the mask is silicon, the etch stop is gold and the mirror is tantalum, suitable etchants would be a mixture of ethylene diamine and pyrocatechol (hot) to etch the mask and a water solution of potassium iodide and iodine to etch the etch stop. It should also be understood that the solvent or etchant wash might only be required to etch or dissolve the etch stop material, with little or no etching of the mask material being required. This is possible because the etch stop underlies and supports the mask material, and the removal of that etch stop material by lateral attack removes the support for the mask which may then be rinsed away. For example, if the mirror is copper and the etch stop is aluminum, a sodium hydroxide solution will remove the etch stop "support" layer. Other etchants for other combinations of etch stop, substrate, and possibly mask materials will be known to those skilled in the art. The resulting mirror with sampling grating formed therein appears as illustrated in FIG. 4.

Typical etch rates to be expected for the photoelectrochemical etching of semiconductor mask 14 are about 5 to 25 Å per second for about 1 milliampere per square centimeter current density at about 1 milliwatt per square centimeter of illumination intensity. There will, of course, be variations due to the wavelength of the light used, the nature of the semiconductor and its crystallite size and the etchant chosen. For a particular wavelength of light in the projected interferogram 30, the etch rate might be increased and shorter exposures obtained by increasing the light intensity. For instance, illumination intensities of 10 milliwatts per square centimeter could yield grating depths of 1,000 Å in approximately 4 to 12 seconds.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of my invention, that which we claim as new and desire to secure by Letters Patent of the United States is:

1. A method for pattern-masking a surface of an object comprising the steps of:

applying a thin, substantially uniform coating of a semiconductive mask material over said surface of said object;

applying and maintaining an electrolytic etchant on the outer surface of said semiconductive mask material;

projecting through said etchant and onto said semiconductive mask material electromagnetic radiation patterned in accordance with the pattern to be formed in the mask, the energy corresponding with wavelength of said electromagnetic radiation being at least as great as the band gap energy of said semiconductive mask material, whereby said semiconductive mask material, whereby said semiconductive mask material electrochemically reacts with and is etched by said etchant at a rate which is substantially faster where said radiation is incident thereon than where it is not; and continuing said photoelectrochemical etching of said semiconductive mask material until a desired depth of etch has been attained.

2. The method of claim 1 including the step of establishing an external conductive circuit between said etchant and a surface of said semiconductive mask material removed from said etchant.

3. The method of claim 2 wherein said step of establishing said external conductive circuit includes the step of connecting externally a source of electrical bias of suitable polarity and sufficient potential for maintaining said etching of said semiconductive mask material at a desired rate.

4. The method of claim 3 wherein said semiconductive mask material is amorphous silicon and said electrical bias in said external circuit is nil.

5. The method of claim 1 wherein said patterned electromagnetic radiation comprises an interferogram.

6. The method of claim 1 wherein the thickness of said coating of semiconductive mask material is in a range between about 1,000 and 10,000 Å.

7. The method of claim 1 wherein said electromagnetic radiation is substantially monochromatic and has a wavelength in the range of 3,000 to about 40,000 Å.

8. The method of claim 7 wherein said electromagnetic radiation has a wavelength in the range of about 4,000 to about 10,000 Å.

9. The method of claim 1 wherein said semiconductive mask material is germanium, gallium arsenide, silicon, indium arsenide, gallium antimonide or indium antimonide.

10. The method of claim 9 wherein said semiconductive mask material is silicon and the wavelength of said electromagnetic radiation is in a range between about 4,000 and 10,000 Å.

11. The method of claim 10 wherein the wavelength of said electromagnetic radiation is at least about 6300 Å.

12. The method of claim 9 wherein said semiconductive mask material is germanium and the wavelength of said electromagnetic radiation is at least about 6300 Å.

13. The method of claim 1 wherein said coating of semiconductive mask material is applied by deposition.

14. The method of claim 1 further including the step of applying a thin coating of etch stop material to said object surface prior to applying said coating of semiconductive mask material, said etch stop material serving to substantially prevent etching of said object by said etchant when said semiconductive mask material is etched through.

15. The method of claim 14 wherein said etchant reacts with said etch stop material to form a compound thereat which is insoluble by said etchant.

16. The method of claim 15 wherein said etch stop material is aluminum and said compound formed by reaction thereof with said etchant is aluminum oxide.

17. The method of claim 15 including a step of establishing an external conductive circuit between said etchant and a surface of said semiconductive mask material removed from said etchant.

18. The method of claim 17 wherein prior to said formation of said etchant-insoluble compound said etch stop material and said object are each electrically conductive and the external conductive circuit includes said object and said etch stop material.

19. The method of claim 14 wherein said photoelectrochemical etching of said object is continued until the pattern is etched through said semiconductive mask material to said etch stop material and is stopped thereby.

20. The method of claim 1 wherein said object is a curved mirror having a reflective surface area greater than about 25 square inches and said pattern corresponds with diffraction gratings to be formed in said mirror, said grating pattern being suitable for diffracting an infrared laser beam.

21. The method of claim 1 wherein the intensity of the electromagnetic radiation is varied within said pattern so as to thereby correspondingly vary the rate of said photoelectrochemical etching of said semiconductive mask material.

22. An object having a pattern-masked surface prepared according to the method of claim 1.

23. A method for modifying the surface of an object in accordance with a particular pattern comprising:

applying a thin, substantially uniform coating of a semiconductive mask material over said surface of said object;

applying and maintaining an electrolytic etchant on the outer surface of said semiconductive mask material;

projecting through said etchant and onto said semiconductive mask material electromagnetic radiation patterned in accordance with the particular pattern by which the surface of the object is to be modified, the wavelength of said electromagnetic radiation being sufficiently short to produce electron-hole pairs in said semiconductive mask material whereby said semiconductive mask material electrochemically reacts with and is etched by said etchant at a rate which is substantially faster where said rotation is incident thereon than where it is not;

continuing said photoelectrochemical etching of said semiconductive mask material at least until said particular pattern has been etched therein; and selectively working the surface of said object in accordance with the pattern etched in said mask material thereby to modify said surface in accordance with said particular pattern.

24. The method of claim 23 wherein said step of working the surface of said object comprises eroding said object surface.

25. The method of claim 24 wherein said step of eroding said object surface comprises ion milling.

26. The method of claim 24 including the step of establishing an external conductive circuit between said etchant and a surface of said semiconductive mask material removed from said etchant.

27. The method of claim 26 including the step of removing the remainder of said semiconductive mask material following said step of eroding said pattern into said object surface.

28. The method of claim 27 further including the step of applying a thin coating of etch stop material over said object surface prior to applying said coating of semiconductive mask material, said etch stop material serving to substantially prevent etching of said object by said etchant when said semiconductive mask material is etched through.

29. An object having a surface modified according to the method of claim 23.

30. The method for producing gratings at a surface of an optical element comprising:

applying a thin, substantially uniform coating of a semiconductive mask material over said surface of said optical element;

applying and maintaining an electrolytic etchant on the outer surface of said semiconductive mask material;

establishing an external conductive circuit between said etchant and a surface of said semiconductive mask material remote from said etchant;

projecting through said etchant and onto said semiconductive mask material electromagnetic radiation patterned in accordance with the pattern to be formed in the mask, the wavelength of said electromagnetic radiation being less than the wavelength corresponding with the band gap energy of said semiconductive mask material, whereby said semiconductive mask material electrochemically reacts with and is etched by said etchant at a rate which is substantially faster where said radiation is incident thereon than where it is not;

continuing said photoelectrochemical etching of said semiconductive mask material at least until the desired optical grating pattern has been etched therein;

eroding said pattern-masked optical element surface to form said gradings therein;

and removing the remainder of said semiconductive mask material comprising said pattern mask.

31. The method of claim 30 further including the step of applying a thin coating of etch stop material over said optical element surface prior to applying said coating of semiconductive mask material, said etch stop material serving to substantially prevent etching of said optical element by said etchant when said semiconductive mask material is etched through.

32. The method of claim 31 wherein said coatings of etch stop material and semiconductive mask material are each applied by respective depositions.

33. A grating in an optical element prepared in accordance with the method of claim 32.

34. The method of claim 30 wherein said eroding of said pattern-masked optical element surface comprises ion milling.

35. The method of claim 30 wherein the intended optical gratings are of varying depth and the intensity of said electromagnetic radiation is varied within said pattern in accordance with said variations in intended grating depth so as to correspondingly vary the rate of said photoelectrochemical etching of said semiconductive mask material.

36. The method of claim 30 wherein said optical element is curved and has a reflective surface area greater than 25 square inches and said gratings are structured for diffracting an infrared laser beam.

37. A grating in an optical element prepared in accordance with the method of claim 36.

38. A grating in an optical element prepared in accordance with the method of claim 30.

* * * * *